(12) United States Patent  (10) Patent No.: US 9,236,299 B2
Zhang et al.                (45) Date of Patent: Jan. 12, 2016

(54) METHODS OF FORMING A METAL CAP LAYER ON COPPER-BASED CONDUCTIVE STRUCTURES ON AN INTEGRATED CIRCUIT DEVICE

(71) Applicant: GLOBALFOUNDRIES Inc., Grand Cayman (KY)

(72) Inventors: Xunyuan Zhang, Albany, NY (US); Hoon Kim, Clifton Park, NY (US); Christian Witt, Woodbridge, CT (US); Larry Zhao, Hoeilaart (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 61 days.

(21) Appl. No.: 14/201,255

(22) Filed: Mar. 7, 2014

(65) Prior Publication Data

US 2015/0255339 A1  Sep. 10, 2015

(51) Int. Cl.
*H01L 21/44* (2006.01)
*H01L 21/768* (2006.01)
*H01L 21/306* (2006.01)

(52) U.S. Cl.
CPC .... *H01L 21/76882* (2013.01); *H01L 21/30625* (2013.01); *H01L 21/76802* (2013.01); *H01L 21/76831* (2013.01); *H01L 21/76834* (2013.01); *H01L 21/76879* (2013.01)

(58) Field of Classification Search
CPC .................... H01L 21/76843; H01L 21/76856
USPC .......................................................... 438/653
See application file for complete search history.

(56) References Cited

U.S. PATENT DOCUMENTS

| | | | |
|---|---|---|---|
| 6,562,711 B1 * | 5/2003 | Powers | 438/622 |
| 7,084,063 B2 * | 8/2006 | Noguchi et al. | 438/691 |
| 2008/0311739 A1 * | 12/2008 | Besling et al. | 438/643 |

* cited by examiner

*Primary Examiner* — Jami M Valentine
(74) *Attorney, Agent, or Firm* — Amerson Law Firm, PLLC (57) ABSTRACT

One method includes forming a barrier layer in a trench/opening in an insulating material, forming a first region of a copper material above the barrier layer, forming a metal layer in the trench/opening on the first region of copper material, forming a second region of copper material on the metal layer, performing at least one CMP process to remove any materials positioned above a planarized upper surface of the layer of insulating material outside of the trench/opening so as to thereby define a structure comprised of the metal layer positioned between the first and second regions of copper material, forming a dielectric cap layer above the layer of insulating material and above the structure, and performing a metal diffusion anneal process to form a metal cap layer adjacent at least the upper surface of a conductive copper structure.

25 Claims, 10 Drawing Sheets

METHODS OF FORMING A METAL CAP LAYER ON COPPER-BASED CONDUCTIVE STRUCTURES ON AN INTEGRATED CIRCUIT DEVICE

BACKGROUND OF THE INVENTION

1. Field of the Invention

Generally, the present disclosure relates to the manufacture of sophisticated semiconductor devices, and, more specifically, to various methods of forming a metal cap layer on copper-based conductive structures on integrated circuit devices and integrated circuit devices having such a structure.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element that substantially determines the performance capabilities of the integrated circuits. During the fabrication of complex integrated circuits using, for instance, MOS technology, millions of transistors, e.g., NFET transistors and/or PFET transistors, are formed on a substrate including a crystalline semiconductor layer. A basic field effect transistor comprises a source region, a drain region and a channel region extending between the source and drain regions. Such a transistor further includes a gate insulation layer positioned above the channel region and a gate electrode positioned above the gate insulation layer. When an appropriate voltage is applied to the gate electrode, i.e., a voltage that exceeds the threshold voltage of the transistor, the channel region becomes conductive and current may flow from the source region to the drain region. The gate electrode may be made of a variety of materials, e.g., polysilicon, one or more layers of metal or combinations thereof. The gate structure of the transistor may be made using so-called "gate-first" or "replacement gate" techniques. In one embodiment, the basic structure of a field effect transistor is typically formed by forming various layers of material and thereafter patterning those layers of material using known photolithography and etching processes. Various doped regions, e.g., source regions, drain regions, halo regions, etc., are typically formed by performing one or more ion implantation processes through a patterned mask layer using an appropriate dopant material, e.g., an N-type dopant or a P-type dopant, to implant the desired dopant material into the substrate. The particular dopant selected depends on the specific implant region being formed and the type of device under construction, i.e., an NFET transistor or a PFET transistor. During the fabrication of complex integrated circuits, millions of transistors, e.g., NFET transistors and/or PFET transistors, are formed on a substrate by performing a number of process operations.

However, the ongoing shrinkage of feature sizes on transistor devices causes certain problems that may at least partially offset the advantages that may be obtained by reduction of the device features. Generally, decreasing the size of, for instance, the channel length of a transistor typically results in higher drive current capabilities and enhanced switching speeds. Upon decreasing the channel length, however, the pitch between adjacent transistors likewise decreases, thereby limiting the size of the conductive contact elements—e.g., those elements that provide electrical connection to the transistor, such as contact vias and the like—that may fit within the available real estate between adjacent transistors. Accordingly, the electrical resistance of conductive contact elements becomes a significant issue in the overall transistor design, since the cross-sectional area of these elements is correspondingly decreased. Moreover, the cross-sectional area of the contact vias, together with the characteristics of the materials they comprise, may have a significant influence on the effective electrical resistance and overall performance of these circuit elements.

A typical integrated circuit product will typically comprise multiple metallization layers, e.g., 10-14 metallization layers. In general, the metallization layers are comprised of layers of insulating material having various conductive metal lines and vias formed therein. In effect, the conductive structures in these various metallization layers constitute the "wiring" arrangement for the various elements of the electrical circuit, e.g., transistors, resistors, capacitors, etc., that are formed in a semiconducting substrate. Increasing the functionality and performance capability of various metallization systems has become important in designing modern semiconductor devices. One example of such improvements is the enhanced use of copper metallization systems in integrated circuit devices and the use of so-called "low-k" dielectric materials (materials having a dielectric constant less than 3) in such devices. Copper metallization systems exhibit improved electrical conductivity as compared to, for example, prior art metallization systems using aluminum for the conductive lines and vias. The use of low-k dielectric materials also tends to improve the signal-to-noise ratio (S/N ratio) by reducing crosstalk as compared to other dielectric materials with higher dielectric constants. However, the use of such low-k dielectric materials can be problematic as they tend to be less resistant to metal migration as compared to some other dielectric materials.

Copper is a material that is difficult to etch using traditional masking and etching techniques. Thus, conductive copper structures, e.g., conductive lines or vias, in modern integrated circuit devices are typically formed using known single or dual damascene techniques. In general, the damascene technique involves: (1) forming a trench/via in a layer of insulating material; (2) depositing one or more relatively thin barrier layers; (3) forming copper material across the substrate and in the trench/via; and (4) performing a chemical mechanical polishing process to remove the excess portions of the copper material and the barrier layer positioned outside of the trench/via to define the final conductive copper structure. The copper material is typically formed by performing an electrochemical copper deposition process after a thin conductive copper seed layer is deposited by physical vapor deposition on the barrier layer.

In many cases, a metal cap layer is formed above the copper structures to protect the underlying copper structures. One technique employed in an attempt to form such metal cap layers involved doping the copper seed layer with a metal, such as copper or manganese. During a high temperature anneal, the dopants were to segregate to the top of the copper structure, i.e., to the top of the metal line. However, given overall device scaling, the thickness of the copper seed layers is so small that a sufficient quantity of dopant material cannot be introduced into the copper seed layer so as to form an effective metal cap layer. Selective deposition processes have been used to selectively deposit a metal cap layer directly on only the copper structure. However, such selective deposition processes are extremely slow, thereby reducing overall product throughput. Moreover, such selective deposition processes typically require pre-deposition cleaning processes and post-deposition plasma or thermal anneal treatments, all of which may degrade device reliability.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a metal cap layer on copper-based conductive structures on integrated circuit devices, and integrated circuit devices having such a structure. In one example, the method includes, among other things, forming a trench/opening in a layer of insulating material, forming a barrier layer in the trench/opening, forming a first region of a copper material above the barrier layer and in the trench/opening, forming a metal layer in the trench/opening on the first region of copper material, forming a second region of copper material on the metal layer, performing at least one chemical mechanical polishing process to remove any materials positioned above a planarized upper surface of the layer of insulating material outside of the trench/opening so as to thereby define a structure comprised of the metal layer positioned between the first and second regions of copper material, forming a dielectric cap layer above the layer of insulating material and above the structure, and performing a metal diffusion anneal process to cause the metal in the metal layer to diffuse laterally outward and upward, thereby resulting in the formation of a metal cap layer adjacent at least an upper surface of a conductive copper structure.

Another illustrative method disclosed herein includes, among other things, forming a trench/opening in a layer of insulating material having a k value of 3.3 or less, forming a barrier layer in the trench/opening and forming a first region of a copper material above the barrier layer and in the trench/opening by (a) depositing a copper seed layer on the barrier layer, (b) performing a copper reflow anneal process causing at least a portion of the copper seed layer to flow to the bottom of the trench/opening and (c) repeating steps (a) and (b) until such time as the first copper region is formed in the trench/opening. In this embodiment, the method further includes forming a metal layer in the trench/opening on the first region of copper material, forming a second region of copper material on the metal layer by performing an electroplating deposition process so as to over-fill the trench/opening with a bulk copper material that is formed on the metal layer, performing at least one chemical mechanical polishing process to remove any materials positioned above a planarized upper surface of the layer of insulating material outside of the trench/opening so as to thereby define a structure comprised of the metal layer positioned between the first and second regions of copper material, forming a dielectric cap layer above the layer of insulating material and above the structure, and performing a metal diffusion anneal process to cause the metal in the metal layer to diffuse laterally outward and upward, thereby resulting in the formation of a metal cap layer adjacent at least an upper surface of a conductive copper structure.

Yet another illustrative method disclosed herein includes, among other things, forming a trench/opening in a layer of insulating material having a k value of 3.3 or less, forming a barrier layer in the trench/opening, forming a first region of a copper material above the barrier layer and in the trench/opening, forming a metal layer in the trench/opening on the first region of copper material, wherein forming the first region of copper material includes depositing a copper seed layer on the barrier layer using a bottom-up-fill deposition process so as to form the first region of copper material in the bottom of the trench/opening, forming a second region of copper material on the metal layer by performing an electroplating deposition process so as to over-fill the trench/opening with a bulk copper material that is formed on the metal layer, performing at least one chemical mechanical polishing process to remove any materials positioned above a planarized upper surface of the layer of insulating material outside of the trench/opening so as to thereby define a structure comprised of the metal layer positioned between the first and second regions of copper material, forming a dielectric cap layer above the layer of insulating material and above the structure, and performing a metal diffusion anneal process to cause the metal in the metal layer to diffuse laterally outward and upward, thereby resulting in the formation of a metal cap layer adjacent at least an upper surface of a conductive copper structure.

In yet another illustrative embodiment, the method includes, among other things, forming a trench/opening in a layer of insulating material having a k value of 3.3 or less, forming a barrier layer in the trench/opening, forming a first region of a copper material above the barrier layer and in the trench/opening, wherein forming the first region of copper material includes depositing a first copper seed layer on the barrier layer, forming a metal layer in the trench/opening on the first region of copper material, forming a second region of copper material on the metal layer by depositing a second copper seed layer on the metal layer and performing an electroplating deposition process so as to over-fill the trench/opening with a bulk copper material that is formed on the second copper seed layer, performing at least one chemical mechanical polishing process to remove any materials positioned above a planarized upper surface of the layer of insulating material outside of the trench/opening so as to thereby define a structure comprised of the metal layer positioned between the first and second regions of copper material, forming a dielectric cap layer above the layer of insulating material and above the structure, and performing a metal diffusion anneal process to cause the metal in the metal layer to diffuse laterally outward and upward, thereby resulting in the formation of a metal cap layer adjacent at least an upper surface of a conductive copper structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a metal cap layer on copper-based conductive structures on integrated circuit devices, and integrated circuit devices having such a structure. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail. The various layers of material depicted in following drawings may be formed by any of a variety of different known techniques, e.g., a chemical vapor deposition (CVD) process, an atomic layer deposition (ALD) process, physical vapor deposition (PVD), a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1A-1H depict one illustrative novel process flow disclosed herein for forming conductive metal cap layers on conductive structures on an integrated circuit product. FIGS. 1A-1H are simplified views of an illustrative integrated circuit device 100 at an early stage of manufacturing that is formed above a semiconducting substrate (not shown). The device 100 may be any type of integrated circuit device that employs any type of a conductive copper structure, such as a conductive line or via, commonly found on integrated circuit devices. As will be discussed more fully below, the methods disclosed herein are directed to the formation of an illustrative line/via conductive feature in a layer of insulating material that is part of a metallization layer of the device 100. A typical integrated circuit product 100 will typically comprise multiple metallization layers, e.g., 10-14 metallization layers. In general, the metallization layers are comprised of layers of insulating material having various conductive metal lines and vias formed therein. In effect, the conductive structures in these various metallization layers constitute the "wiring" arrangement for the various elements (not shown) of the electrical circuit, e.g., transistors, resistors, capacitors, etc., that are formed in a semiconducting substrate. To facilitate disclosure of the present invention, only a single metallization layer will be depicted herein. However, after a complete reading of the present application, those skilled in the art will appreciate and understand that the inventions disclosed herein may be employed at any or all levels within an integrated circuit product.

The line/via conductive features depicted herein are intended to be representative of any type of conductive copper structure that may be formed on an integrated circuit product. The illustrative line/via conductive features may be of any desired shape, depth or configuration. For example, in some embodiments, the line/via conductive feature may be a classic metal line that does not extend to an underlying layer of material (not shown). In other embodiments, the line/via conductive features may be through-hole type features, e.g., a classic via, that extends all of the way through one layer of insulating material and contacts an underlying layer of material (not shown) or an underlying conductive structure (not shown). Thus, the shape, size, depth or configuration of the line/via conductive features depicted herein should not be considered to be a limitation of the present invention.

Figure 1A:
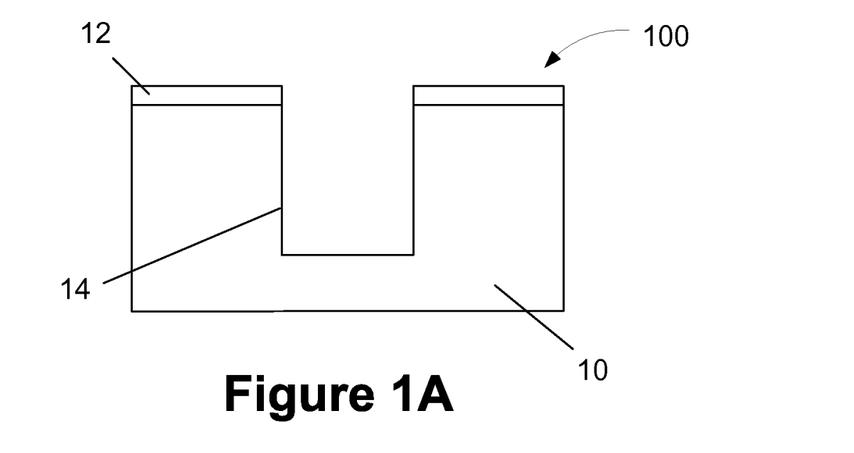
FIGS. 1A-1H depict one illustrative novel process flow disclosed herein for forming conductive metal cap layers on conductive structures on an integrated circuit product.

At the point of fabrication depicted in FIG. 1A, an illustrative layer of insulating material 10 and an illustrative hard mask layer 12 have been formed above a semiconductor substrate (not shown). An illustrative trench/opening 14 has been formed in the layer of insulating material 10 using traditional photolithography and etching processes. The term "trench/opening" is used to reflect that the methods disclosed herein may be employed in forming both metal lines and vias. Ultimately, a copper-containing conductive structure will be formed in the illustrative trench/opening 14. The layer of insulating material 10 is also intended to be representative in nature as it represents any type of insulating material, e.g., a layer of silicon dioxide or a layer of so-called low-k insulating material (having a k value less than about 3.3). The hard mask layer 12 may also be comprised of a variety of different materials, e.g., silicon nitride.

Figure 1B:
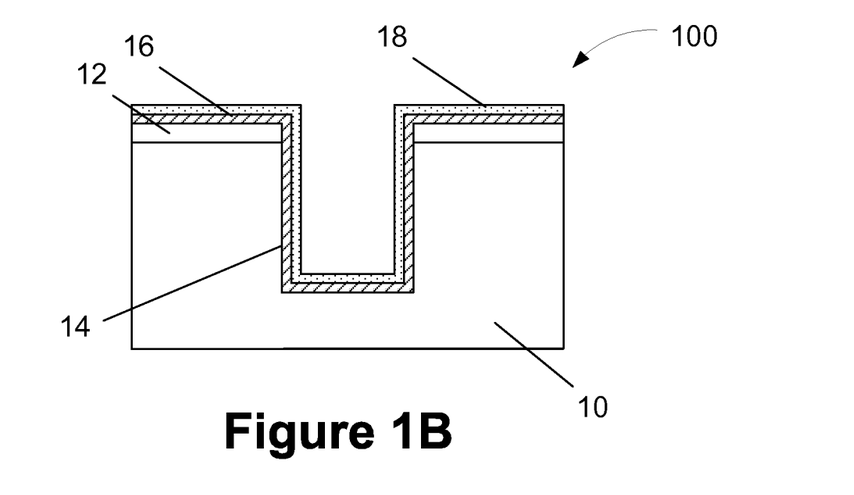

FIG. 1B depicts the product 100 after a barrier metal layer 16 and a copper seed layer 18 have been formed on the product 100 by performing a plurality of conformal depositions processes, e.g., conformal ALD, CVD or PVD processes. In one illustrative example, the barrier metal layer 16 may be comprised of a material such as, for example, TaN, RuTiN, MnN, Ta, Co, Ru, manganese silicate, etc., and its thickness may be on the order of about 0.5-2 nm. The copper seed layer 18 may be formed by performing a conventional PVD deposition process, an ALD process or an electroless copper deposition process. In one illustrative embodiment, the copper seed layer 18 may have a thickness on the order of about 5 nm.

Figure 1C:
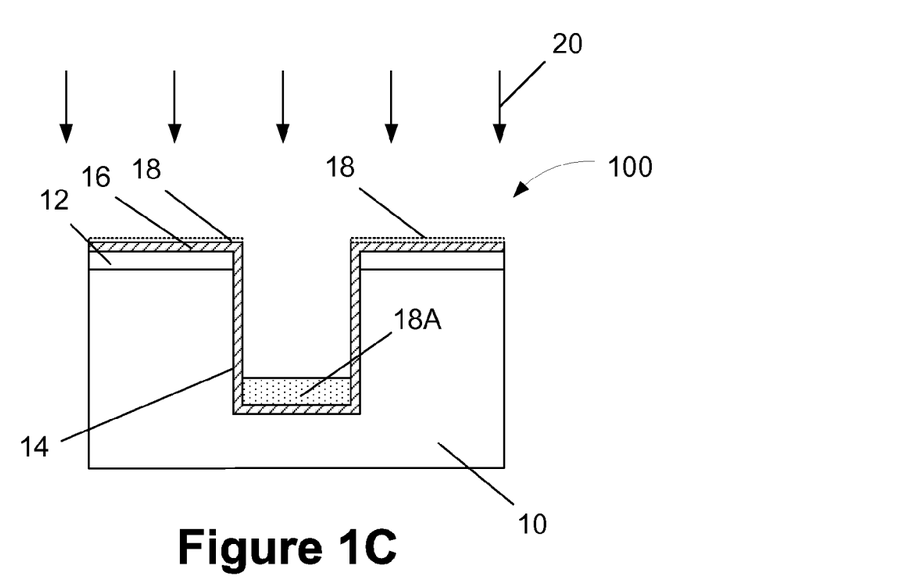

FIG. 1C depicts the product 100 after a copper reflow anneal process 20 is performed on the product 100. In general, the copper reflow anneal process 20 causes the copper material—depicted with the reference number 18A—to flow to the bottom of the trench/opening 14. Note that, in some cases, after the copper reflow anneal process 20 is performed, there may or may not be some of the copper seed layer 18 positioned above the hard mask layer 12. Thus, the copper seed layer 18 is depicted in dashed lines in FIG. 1C. However, the depiction of such remaining portions of the original copper seed layer 18 is not depicted in any of the subsequent drawings. In one illustrative embodiment, the copper reflow anneal process 20 may be performed at a temperature that falls within the range of 100-300° C. for a duration that falls within the range of about 5-60 seconds in an oxygen-free processing ambient, such as an inert gas processing ambient.

Figure 1D:
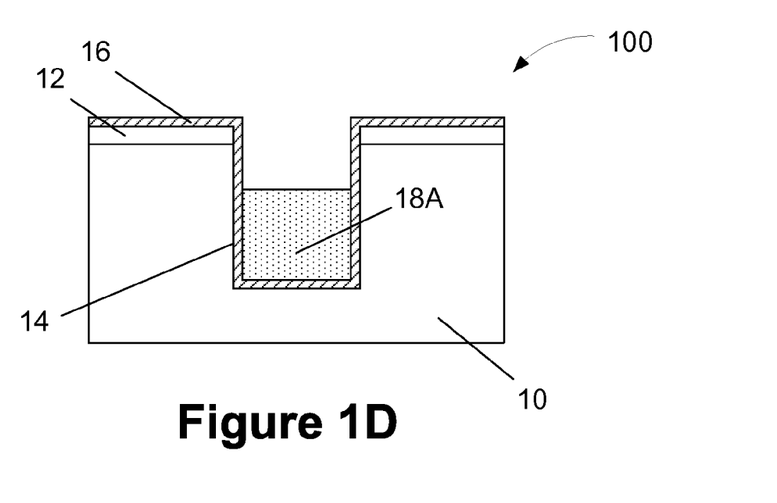

Using the method disclosed herein, the steps of depositing the copper seed layer 18 and performing the copper reflow anneal process 20 are repeated until such time as the trench/opening 14 is filled with the desired amount of copper material 18A. FIG. 1D depicts the product 100 after the desired amount of the copper material 18A has been deposited in the trench/opening 14 by repeating the processing sequence described above. The degree to which the trench/opening 14 is filled with the copper material 18A may vary depending upon the particular application. In one illustrative example, the processing sequence described above (deposition of the seed layer 18 followed by performing the copper reflow anneal process 20) is repeated until such time as approximately two-thirds of the trench/opening 14 is filled with the copper material 18A, as depicted in FIG. 1D.

Figure 1E:
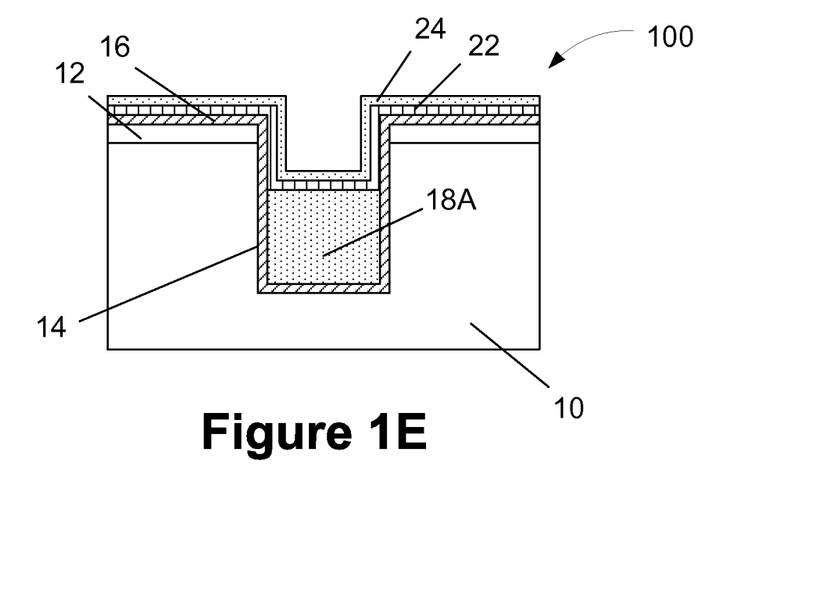

FIG. 1E depicts the product 100 after several process operations were performed. First, a metal layer 22 was deposited on the product and within the trench/opening 14 by performing a conformal ALD or CVD process operation. In one illustrative embodiment, the metal layer 22 may be relatively thin, e.g., a thickness of about 1 nm, and it may be comprised of metal such as Co, Pt, Ir, W, etc., with cobalt being a leading candidate, or a copper-insoluble. As used herein and in the claims, the term "copper insoluble metal" shall mean a metal wherein the dissolved remaining impurity in the core copper material of the final conductive structure after the metal cap layer 32 is formed (as described below) is 100 ppm or less. Next, another copper seed layer 24 is formed on the metal layer 22 by performing a conventional PVD deposition process, an ALD process or an electroless copper deposition process.

Figure 1F:
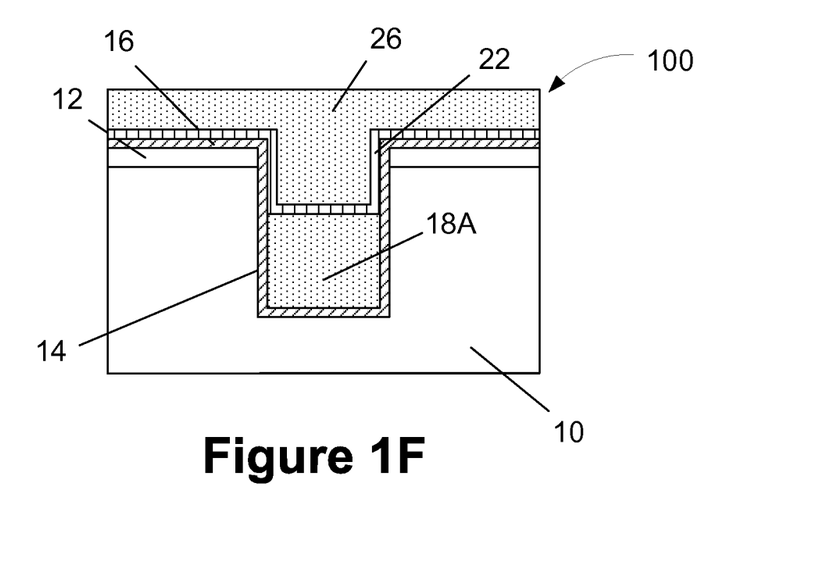

FIG. 1F depicts the product 100 after an electroplating process was performed to form bulk copper material 26 across the product and to over-fill the trench/opening 14 and after a typical post-plating anneal process (25-400° C. for a duration of about 1-60 seconds in an oxygen-free ambient) was performed.

Figure 1G:
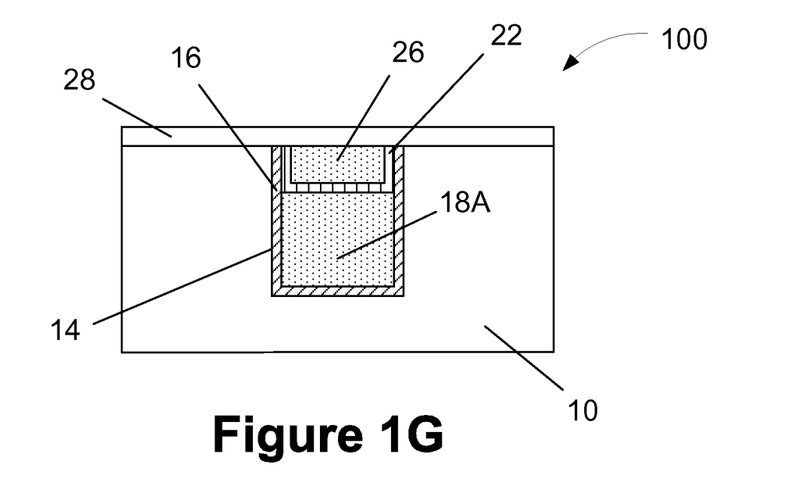

FIG. 1G depicts the product 100 after several process operations were performed. First, one or more chemical mechanical polishing (CMP) processes were performed using the layer of insulating material 10 as the final polish-stop layer. This CMP process(es) effectively removes all materials positioned outside of the trench/opening 14 and above the final planarized surface of the layer of insulating material 10. Next, a cap layer 28 was deposited on the product 100. The cap layer 28 may be comprised of a variety of different materials such as, for example, silicon nitride. Note that, at this point in the process flow, the remaining portions of the metal layer 22 are embedded in copper material.

Figure 1H:
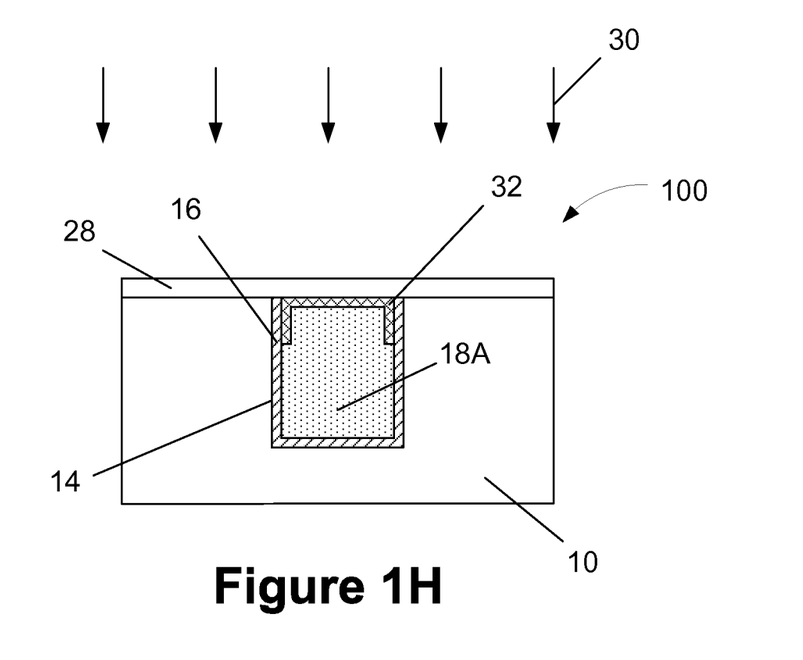

FIG. 1H depicts the product 100 after a metal diffusion anneal process 30 is performed on the product 100 with the cap layer 28 in position. In general, the metal diffusion anneal process 30 causes the metal in the embedded metal layer 22, e.g., cobalt, manganese, etc., to diffuse laterally outward and upward, thereby resulting in the formation of the depicted metal cap layer 32 that protects the underlying copper materials. Note that the metal diffusion anneal process 30 was performed with the cap layer 28 in position. Typically, the resulting metal cap layer 32 may have the same approximate thickness as the metal layer 22. In one illustrative embodiment, the metal diffusion anneal process 30 may be performed at a temperature that falls within the range of 200-400° C. for a duration that falls within the range of about 1-3 hours in an oxygen-free processing ambient, such as an inert gas processing ambient.

Figures 2A, 2B:
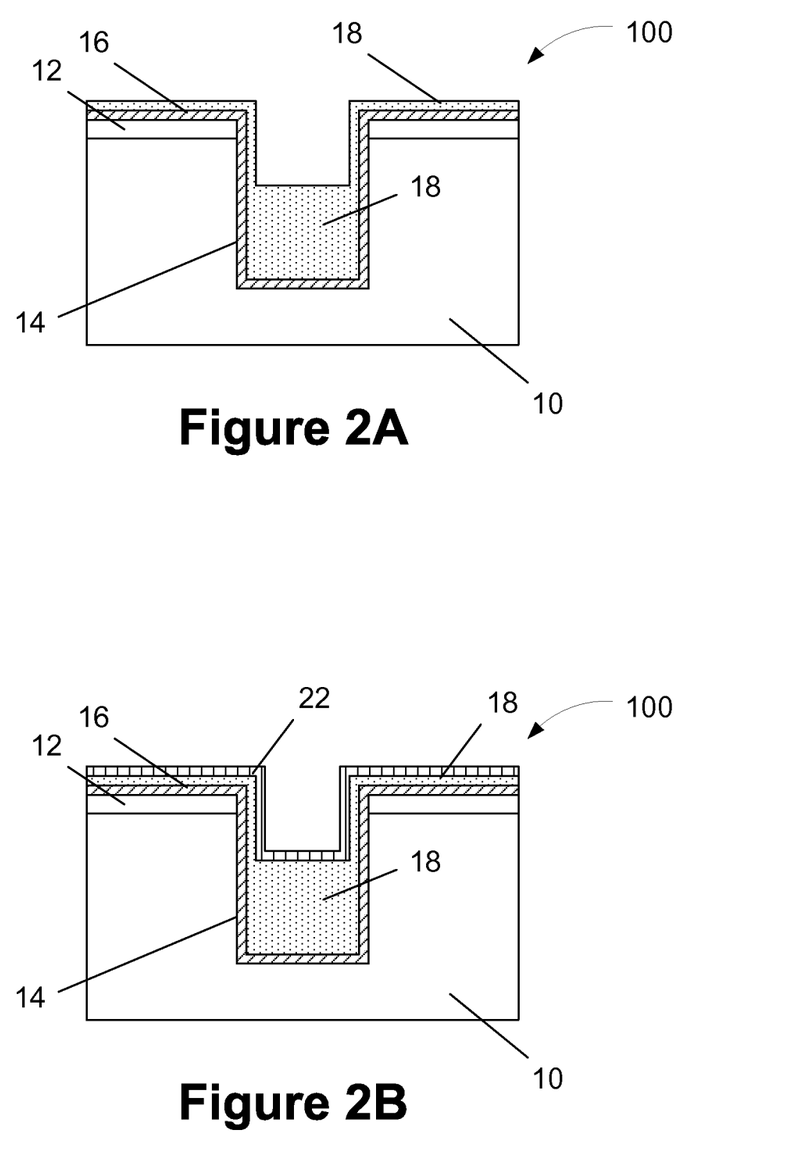
FIGS. 2A-2E depict another illustrative novel process flow disclosed herein for forming conductive metal cap layers on conductive structures on an integrated circuit product.

FIGS. 2A-2E depict another illustrative novel process flow disclosed herein for forming conductive metal cap layers on conductive structures on an integrated circuit product. FIG. 2A depicts the product 100 at a point in processing wherein the above-described barrier metal layer 16 was formed on the product. In this embodiment, the deposition process that is performed to form the copper seed layer 18 is a process wherein the bottom of the trench 13 is preferentially filled with copper material, i.e., "bottom-up-fill" process, as the copper material is being formed. In one illustrative embodiment, such a bottom-up-fill deposition process may be accomplished by performing an iodine assisted CVD or ELD copper deposition process. The bottom-up-fill process is performed for a sufficient duration such that the desired amount of copper material 18 is positioned in the bottom of the trench/opening 14, i.e., until the trench/opening 14 is approximately two-thirds full of the copper material.

FIG. 2B depicts the product 100 after the above-described metal layer 22 was deposited on the product and within the trench/opening 14.

Figure 2C:
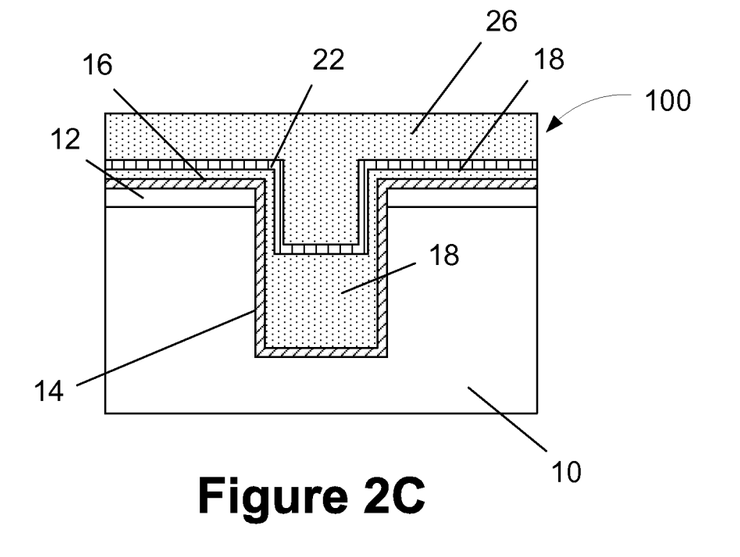

FIG. 2C depicts the product 100 after the above-described electroplating process was performed to form the above-described bulk copper material 26 across the product and to over-fill the trench/opening 14, and after the above-described post-plating anneal process was performed.

Figure 2D:
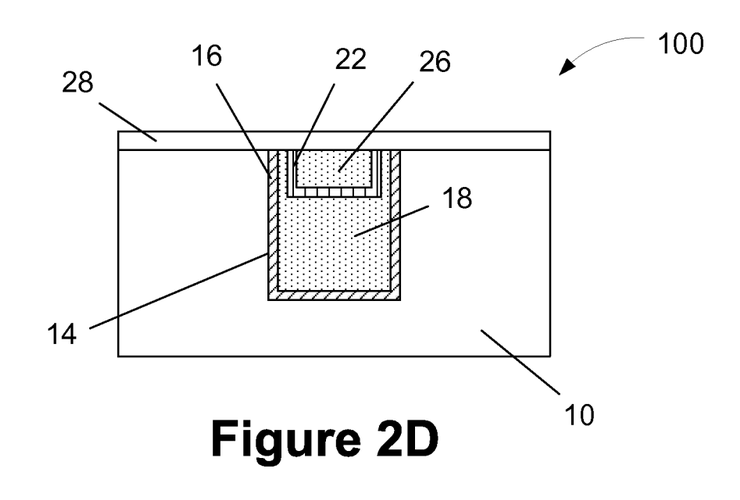

FIG. 2D depicts the product 100 after one or more CMP processes were performed using the layer of insulating material 10 as the final polish-stop layer. This CMP process(es) effectively removes all materials positioned outside of the trench/opening 14 and above the final planarized surface of the layer of insulating material 10. Next, the above-described cap layer 28 was deposited on the product 100. Note that, at this point in the process flow, the remaining portions of the metal layer 22 are embedded in copper material.

Figure 2E:
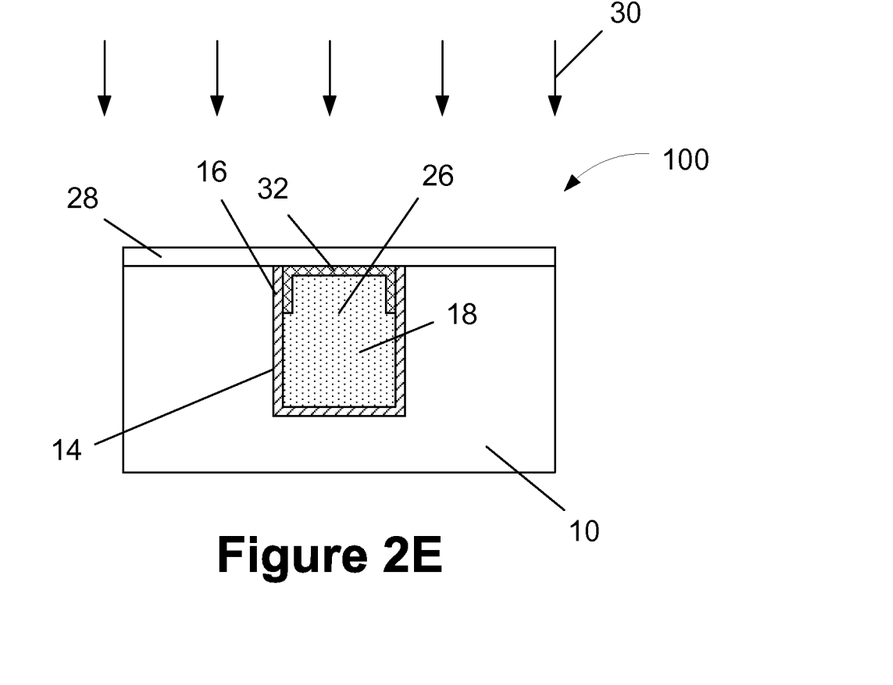

FIG. 2E depicts the product 100 after the above-described metal diffusion anneal process 30 is performed on the product 100 to cause the formation of the depicted metal cap layer 32 that protects the underlying copper materials.

FIGS. 3A-3F depict yet another illustrative novel process flow disclosed herein for forming conductive metal cap layers on conductive structures on an integrated circuit product.

Figure 3A:
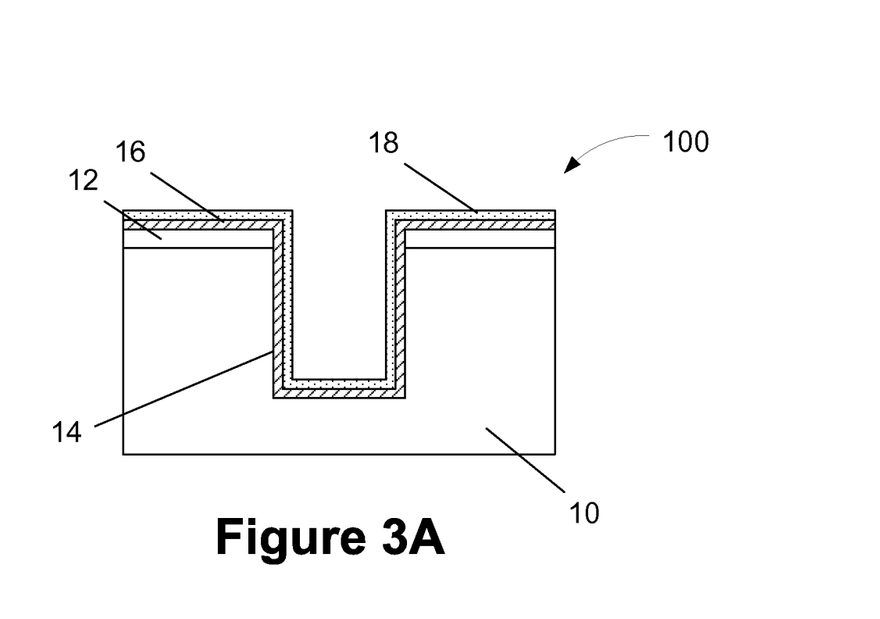
FIGS. 3A-3F depict yet another illustrative novel process flow disclosed herein for forming conductive metal cap layers on conductive structures on an integrated circuit product.

FIG. 3A depicts the product 100 at a point in processing corresponding to that depicted in FIG. 1B.

Figure 3B:
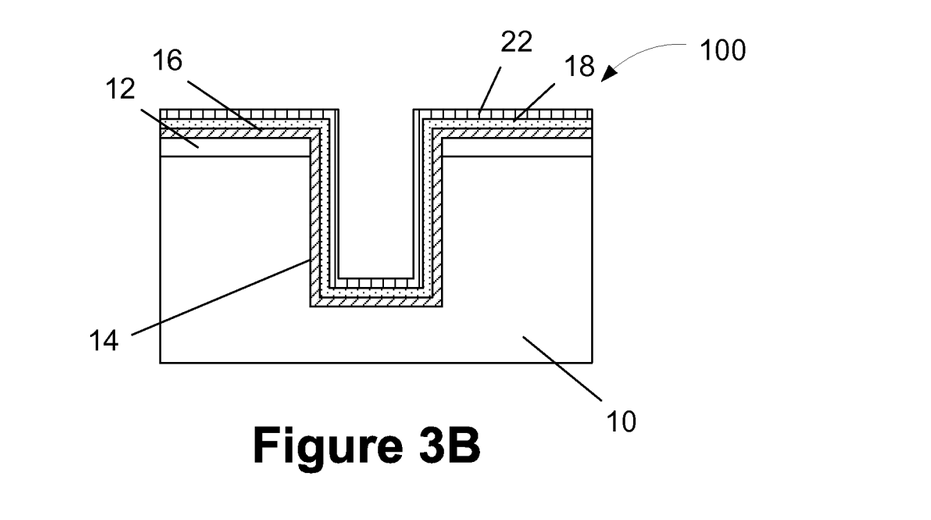

FIG. 3B depicts the product 100 after the above-described metal layer 22 was deposited on the first copper seed layer 18 and within the trench/opening 14.

Figure 3C:
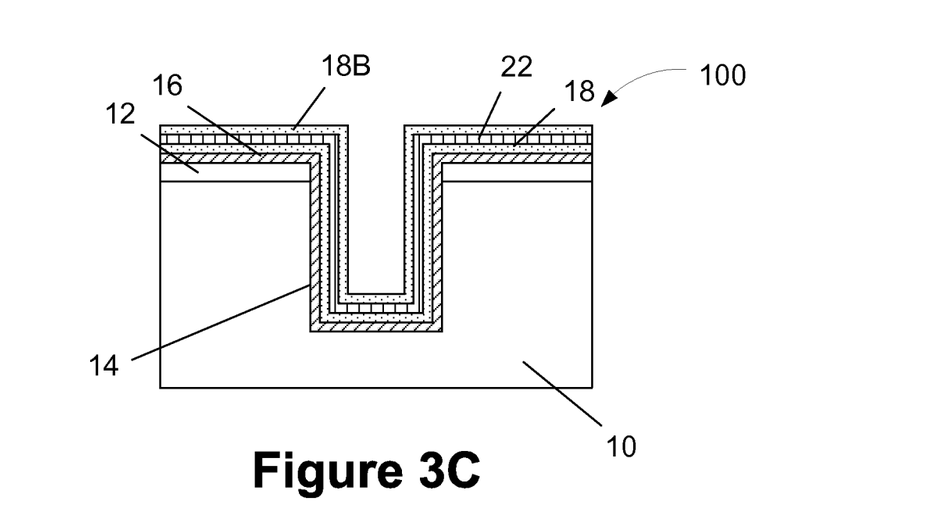

FIG. 3C depicts the product 100 after another copper seed layer 18B was deposited on the metal layer 22 and within the trench/opening 14.

Figure 3D:
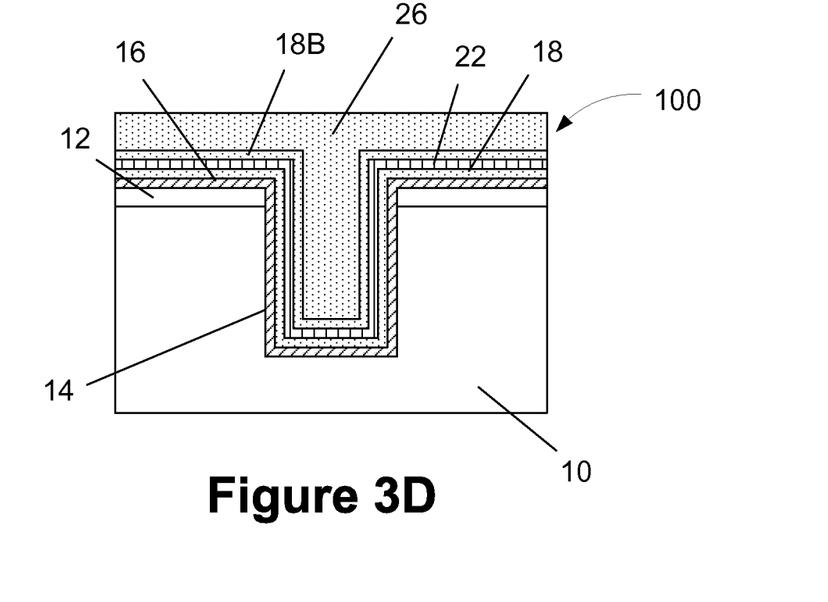

FIG. 3D depicts the product 100 after the above-described electroplating process was performed to form the above-described bulk copper material 26 across the product and to over-fill the trench/opening 14, and after the above-described post-plating anneal process was performed.

Figure 3E:
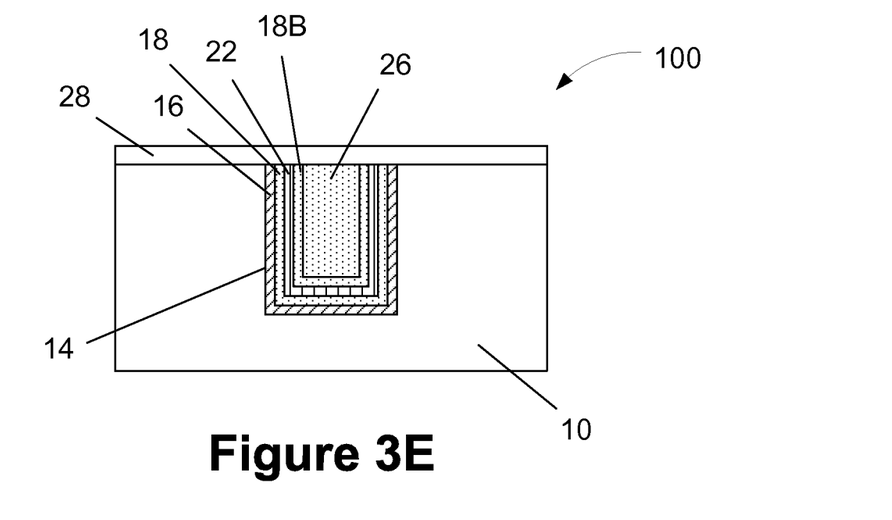

FIG. 3E depicts the product 100 after one or more CMP processes were performed using the layer of insulating material 10 as the final polish-stop layer. This CMP process(es) effectively removes all materials positioned outside of the trench/opening 14 and above the final planarized surface of the layer of insulating material 10. Next, the above-described cap layer 28 was deposited on the product 100. Note that, at this point in the process flow, the remaining portions of the metal layer 22 are embedded in copper material.

Figure 3F:
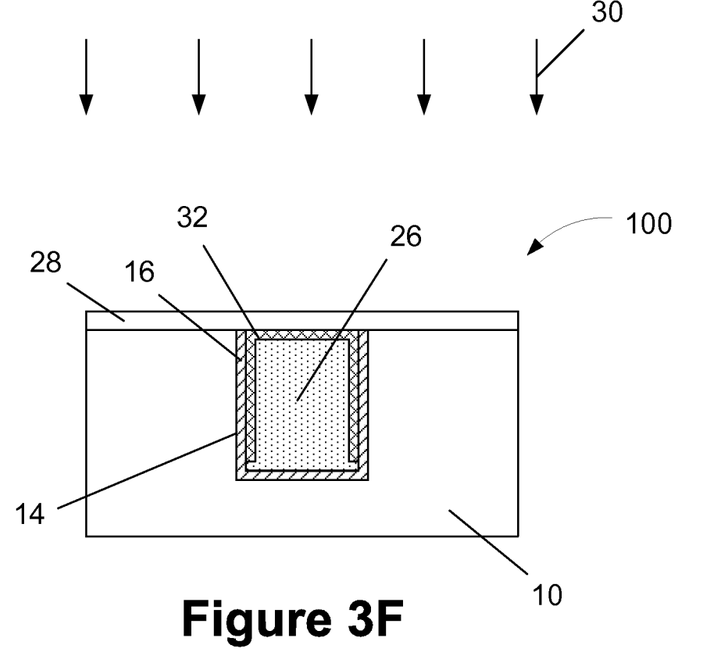

FIG. 3F depicts the product 100 after the above-described metal diffusion anneal process 30 was performed on the product 100 to cause the formation of the depicted metal cap layer 32 that protects the underlying copper materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a trench/opening in a layer of insulating material;
   forming a barrier layer in said trench/opening;
   forming a first region of a copper material above said barrier layer and in said trench/opening;
   forming a metal layer in said trench/opening on said first region of copper material;
   forming a second region of copper material on said metal layer;
   performing at least one chemical mechanical polishing process to remove any materials positioned above a planarized upper surface of said layer of insulating material outside of said trench/opening so as to thereby define a structure comprised of said metal layer positioned between said first and second regions of copper material;
   forming a dielectric cap layer above said layer of insulating material and above said structure; and
   after forming said dielectric cap layer, performing a metal diffusion anneal process to cause the metal in said metal layer to diffuse laterally outward and upward, thereby resulting in the formation of a metal cap layer adjacent at least an upper surface of a conductive copper structure.

2. The method of claim 1, wherein performing said metal diffusion anneal process comprises performing said metal diffusion anneal process at a temperature that falls within the range of 200-400° C. for a duration that falls within the range of about 1-3 hours in an oxygen-free processing ambient.

3. The method of claim 1, wherein said first region of copper material fills about two-thirds of a depth of said trench/opening.

4. The method of claim of claim 1, wherein forming said second region of copper material comprises:
   performing an electroplating deposition process so as to over-fill said trench/opening with a bulk copper material; and
   performing a post-plating anneal process at a temperature within the range of 25-400° C. for a duration of about 1-60 seconds in an oxygen-free ambient.

5. The method of claim 1, wherein forming said first region of copper material comprises:
   (a) depositing a copper seed layer on said barrier layer;
   (b) performing a copper reflow anneal process that causes at least a portion of said copper seed layer to flow to the bottom of said trench/opening; and
   (c) repeating steps (a) and (b) until such time as said first region of copper material is formed in said trench/opening.

6. The method of claim 5, wherein said copper reflow anneal process is performed at a temperature that falls within the range of 100-300° C. for a duration that falls within the range of about 5-60 seconds in an oxygen-free processing ambient.

7. The method of claim 1, wherein said metal layer is comprised of one of Co, Pt, Ir or W.

8. The method of claim 1, wherein said metal layer is comprised of a copper-insoluble metal.

9. The method of claim 1, wherein forming said first region of copper material comprises depositing a copper seed layer on said barrier layer using a bottom-up-fill deposition process so as to form said first region of copper material in the bottom of said trench/opening.

10. The method of claim of claim 9, wherein forming said second region of copper material comprises:
    performing an electroplating deposition process so as to over-fill said trench/opening with a bulk copper material that is formed on said metal layer; and
    performing a post-plating anneal process at a temperature within the range of 25-400° C. for a duration of about 1-60 seconds in an oxygen-free ambient.

11. The method of claim 1, wherein forming said first region of copper material comprises depositing a first copper seed layer on said barrier layer.

12. The method of claim 11, wherein forming said second region of copper material comprises:
    depositing a second copper seed layer on said metal layer;
    performing an electroplating deposition process so as to over-fill said trench/opening with a bulk copper material that is formed on said second copper seed layer; and
    performing a post-plating anneal process at a temperature within the range of 25-400° C. for a duration of about 1-60 seconds in an oxygen-free ambient.

13. The method of claim 1, wherein said layer of insulating material is comprised of silicon dioxide or an insulating material having a k value less than about 3.3.

14. A method, comprising:
    forming a trench/opening in a layer of insulating material having a k value of 3.3 or less;
    forming a barrier layer in said trench/opening;
    forming a first region of copper material above said barrier layer and in said trench/opening by:
    (a) depositing a copper seed layer on said barrier layer;
    (b) performing a copper reflow anneal process that causes at least a portion of said copper seed layer to flow to the bottom of said trench/opening; and
    (c) repeating steps (a) and (b) until such time as said first region of copper material is formed in said trench/opening;

forming a metal layer in said trench/opening on said first region of copper material;

forming a second region of copper material on said metal layer by performing an electroplating deposition process so as to over-fill said trench/opening with a bulk copper material that is formed on said metal layer;

performing at least one chemical mechanical polishing process to remove any materials positioned above a planarized upper surface of said layer of insulating material outside of said trench/opening so as to thereby define a structure comprised of said metal layer positioned between said first and second regions of copper material;

forming a dielectric cap layer above said layer of insulating material and above said structure; and performing a metal diffusion anneal process to cause the metal in said metal layer to diffuse laterally outward and upward, thereby resulting in the formation of a metal cap layer adjacent at least an upper surface of a conductive copper structure.

15. The method of claim 14, wherein performing said metal diffusion anneal process comprises performing said metal diffusion anneal process at a temperature that falls within the range of 200-400° C. for a duration that falls within the range of about 1-3 hours in an oxygen-free processing ambient.

16. The method of claim 14, further comprising performing a post-plating anneal process at a temperature within the range of 25-400° C. for a duration of about 1-60 seconds in an oxygen-free ambient.

17. The method of claim 14, wherein said metal diffusion anneal process is performed after the formation of said dielectric cap layer.

18. A method, comprising:

forming a trench/opening in a layer of insulating material having a k value of 3.3 or less;

forming a barrier layer in said trench/opening;

forming a first region of copper material above said barrier layer and in said trench/opening;

forming a metal layer in said trench/opening on said first region of copper material, wherein forming said first region of copper material comprises depositing a copper seed layer on said barrier layer using a bottom-up-fill deposition process so as to form said first region of copper material in the bottom of said trench/opening;

forming a second region of copper material on said metal layer by performing an electroplating deposition process so as to over-fill said trench/opening with a bulk copper material that is formed on said metal layer;

performing at least one chemical mechanical polishing process to remove any materials positioned above a planarized upper surface of said layer of insulating material outside of said trench/opening so as to thereby define a structure comprised of said metal layer positioned between said first and second regions of copper material;

forming a dielectric cap layer above said layer of insulating material and above said structure; and performing a metal diffusion anneal process to cause the metal in said metal layer to diffuse laterally outward and upward, thereby resulting in the formation of a metal cap layer adjacent at least an upper surface of a conductive copper structure.

19. The method of claim 18, wherein performing said metal diffusion anneal process comprises performing said metal diffusion anneal process at a temperature that falls within the range of 200-400° C. for a duration that falls within the range of about 1-3 hours in an oxygen-free processing ambient.

20. The method of claim 19, further comprising performing a post-plating anneal process at a temperature within the range of 25-400° C. for a duration of about 1-60 seconds in an oxygen-free ambient.

21. The method of claim 18, wherein said metal diffusion anneal process is performed after the formation of said dielectric cap layer.

22. A method, comprising:

forming a trench/opening in a layer of insulating material having a k value of 3.3 or less;

forming a barrier layer in said trench/opening;

forming a first region of copper material above said barrier layer and in said trench/opening, wherein forming said first region of copper material comprises depositing a first copper seed layer on said barrier layer;

forming a metal layer in said trench/opening on said first region of copper material;

forming a second region of copper material on said metal layer by depositing a second copper seed layer on said metal layer and performing an electroplating deposition process so as to over-fill said trench/opening with a bulk copper material that is formed on said second copper seed layer;

performing at least one chemical mechanical polishing process to remove any materials positioned above a planarized upper surface of said layer of insulating material outside of said trench/opening so as to thereby define a structure comprised of said metal layer positioned between said first and second regions of copper material;

forming a dielectric cap layer above said layer of insulating material and above said structure; and performing a metal diffusion anneal process to cause the metal in said metal layer to diffuse laterally outward and upward, thereby resulting in the formation of a metal cap layer adjacent at least an upper surface of a conductive copper structure.

23. The method of claim 22, wherein performing said metal diffusion anneal process comprises performing said metal diffusion anneal process at a temperature that falls within the range of 200-400° C. for a duration that falls within the range of about 1-3 hours in an oxygen-free processing ambient.

24. The method of claim 23, further comprising performing a post-plating anneal process at a temperature within the range of 25-400° C. for a duration of about 1-60 seconds in an oxygen-free ambient.

25. The method of claim 22, wherein said metal diffusion anneal process is performed after the formation of said dielectric cap layer.

* * * * *